United States Patent
Liu et al.

(10) Patent No.: US 9,864,054 B2
(45) Date of Patent: Jan. 9, 2018

(54) SYSTEM AND METHOD FOR 3D SAR IMAGING USING COMPRESSIVE SENSING WITH MULTI-PLATFORM, MULTI-BASELINE AND MULTI-PRF DATA

(71) Applicant: Mitsubishi Electric Research Laboratories, Inc., Cambridge, MA (US)

(72) Inventors: Dehong Liu, Lexington, MA (US); Petros T. Boufounos, Boston, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 114 days.

(21) Appl. No.: 14/202,449

(22) Filed: Mar. 10, 2014

(65) Prior Publication Data
US 2015/0253423 A1    Sep. 10, 2015

(51) Int. Cl.
G01S 13/90    (2006.01)
H03M 7/30    (2006.01)
G01S 13/22    (2006.01)
G01S 13/42    (2006.01)

(52) U.S. Cl.
CPC ....... G01S 13/9035 (2013.01); H03M 7/3062 (2013.01); *G01S 13/22* (2013.01); *G01S 13/42* (2013.01)

(58) Field of Classification Search
CPC ......... G01S 7/295; G01S 7/2955; G01S 13/90
USPC .................................. 342/25 R, 25 A, 25 B
See application file for complete search history.

(56) References Cited

U.S. PATENT DOCUMENTS

| 5,659,318 A * | 8/1997 | Madsen ............. G01S 13/9023 342/156 |
| 6,476,755 B1 * | 11/2002 | Senio ....................... G01S 7/38 342/15 |
| 7,928,893 B2 | 4/2011 | Baraniuk et al. |
| 8,471,759 B2 | 6/2013 | Sun et al. |
| 2012/0250748 A1 * | 10/2012 | Nguyen ................. G01S 13/90 375/224 |

OTHER PUBLICATIONS

F. Gini, F. Lombardini, and M. Montanari, "Layover solution in multibaseline SAR interferometry," IEEE Trans. Aerospace and Electronic Systems, vol. 38(4), pp. 1344-1356, Oct. 2002.
G. Fornaro, F. Serafino, and F. Soldovieri, "Three-dimensional focusing with multipass SAR data," IEEE Trans. Geoscience and Remote Sensing, vol. 41(3), pp. 507-517, Mar. 2003.

(Continued)

*Primary Examiner* — Jack W Keith
*Assistant Examiner* — Helena Seraydaryan
(74) *Attorney, Agent, or Firm* — Gene Vinokur; James McAleenan; Hironori Tsukamoto

(57) ABSTRACT

A method generates a 3D synthetic aperture radar (SAR) image of an area by first acquiring multiple data sets from the area using one or more SAR systems, wherein each SAR system has one or more parallel baselines and multiple pulse repetition frequency (PRF), wherein the PRF for each baseline is different. The data sets are registered and aligned to produce aligned data sets. Then, a 3D compressive sensing reconstruction procedure is applied to the aligned data sets to generate the 3D image corresponding to the area.

14 Claims, 6 Drawing Sheets

(56) References Cited

OTHER PUBLICATIONS

X. X. Zhu and R. Bamler, "Tomographic SAR inversion by L1-norm regularization—the compressive sensing approach," IEEE Trans. Geoscience and Remote Sensing, vol. 48(10), pp. 3839-3846, Oct. 2010.

J. M. Lopez-Sanchez and J. Fortuny-Guasch, "3-D imaging using range migration techniques," IEEE Trans. antennas and propagation, vol. 48(5), pp. 728-737, May 2000.

X. Zhuge and A. G. Yarovoy, "Three-dimensional near-field MIMO array imaging using range migration techniques," IEEE Trans. Image Processing, vol. 21(6), pp. 3026-3033, Jun. 2012.

* cited by examiner

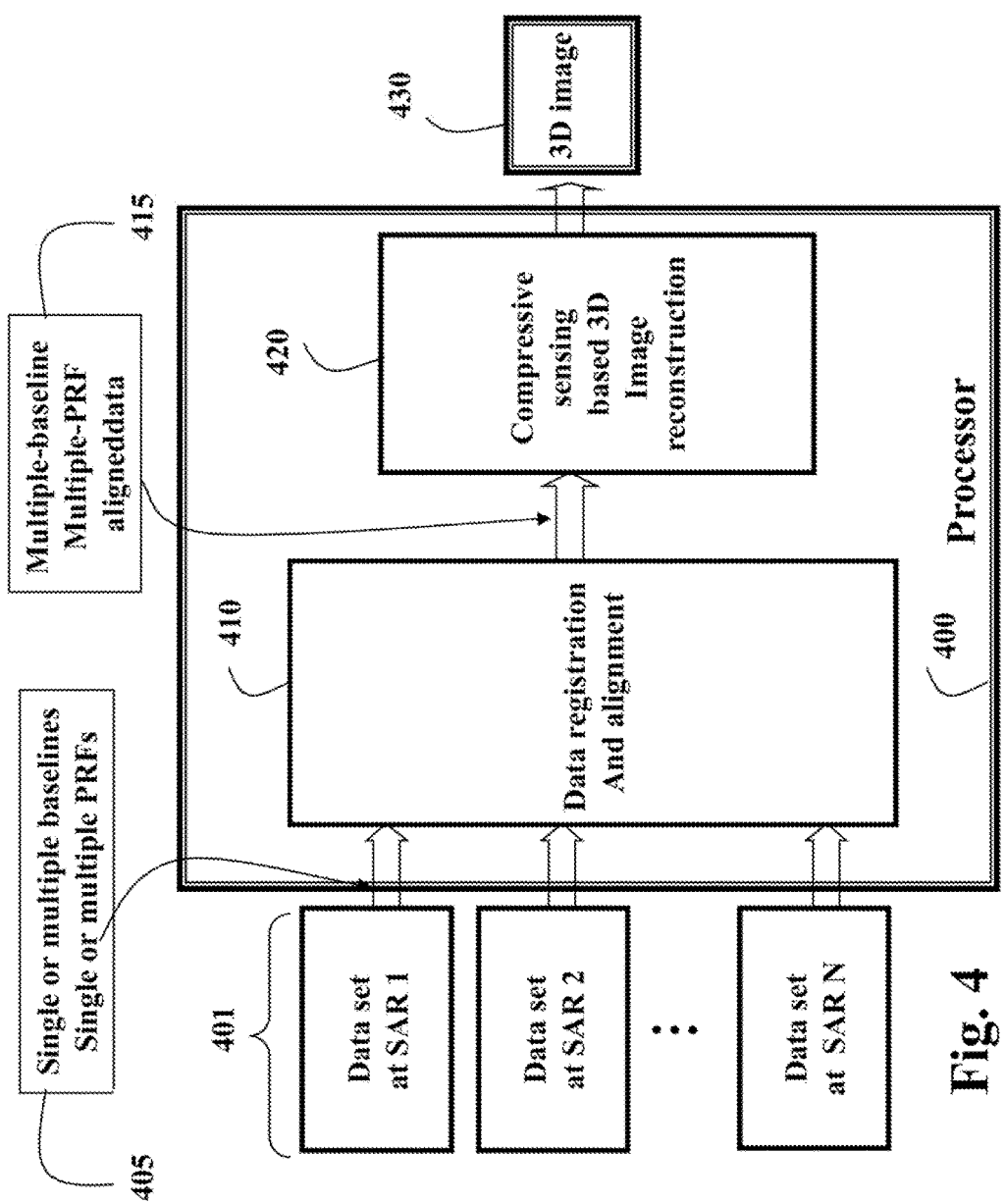

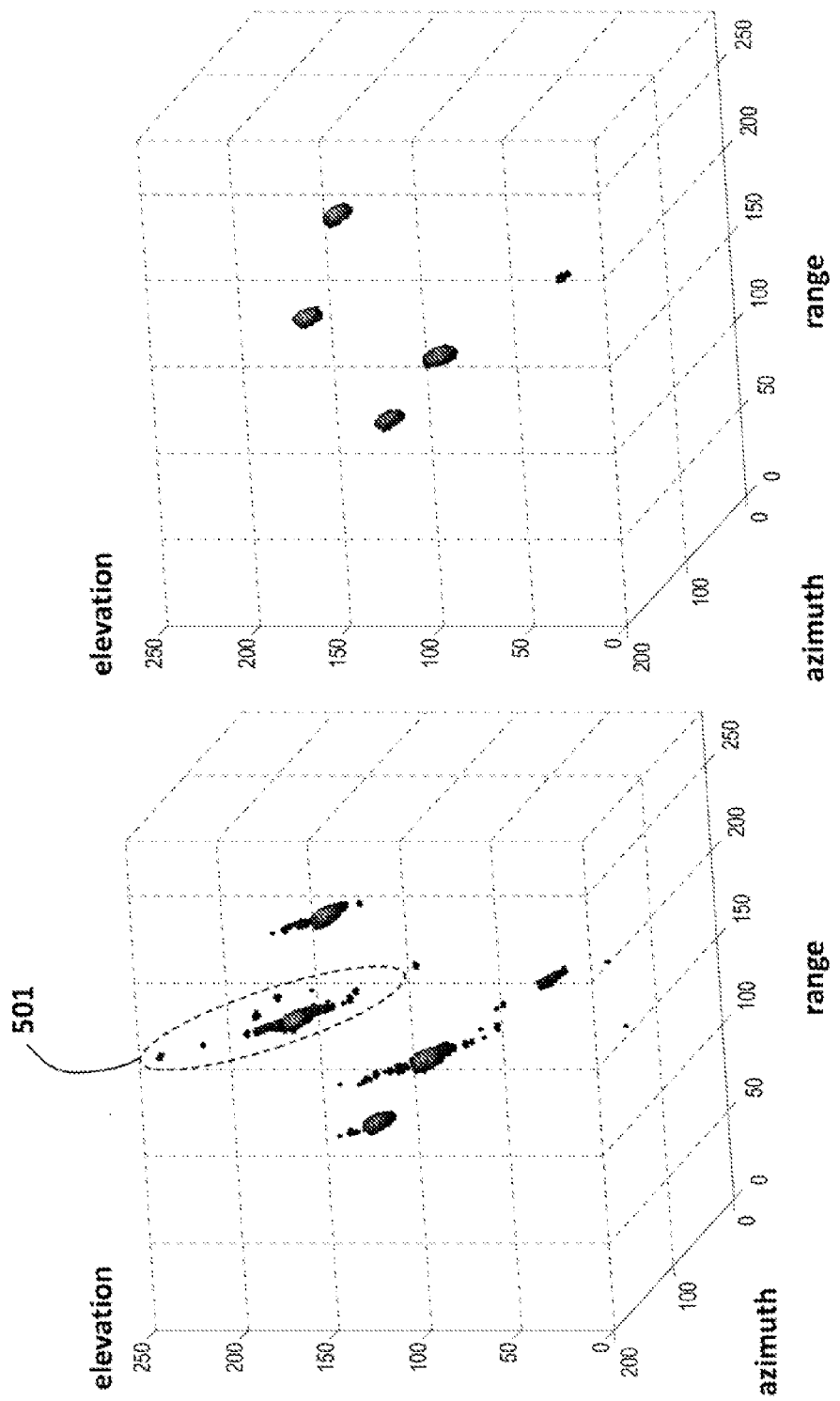

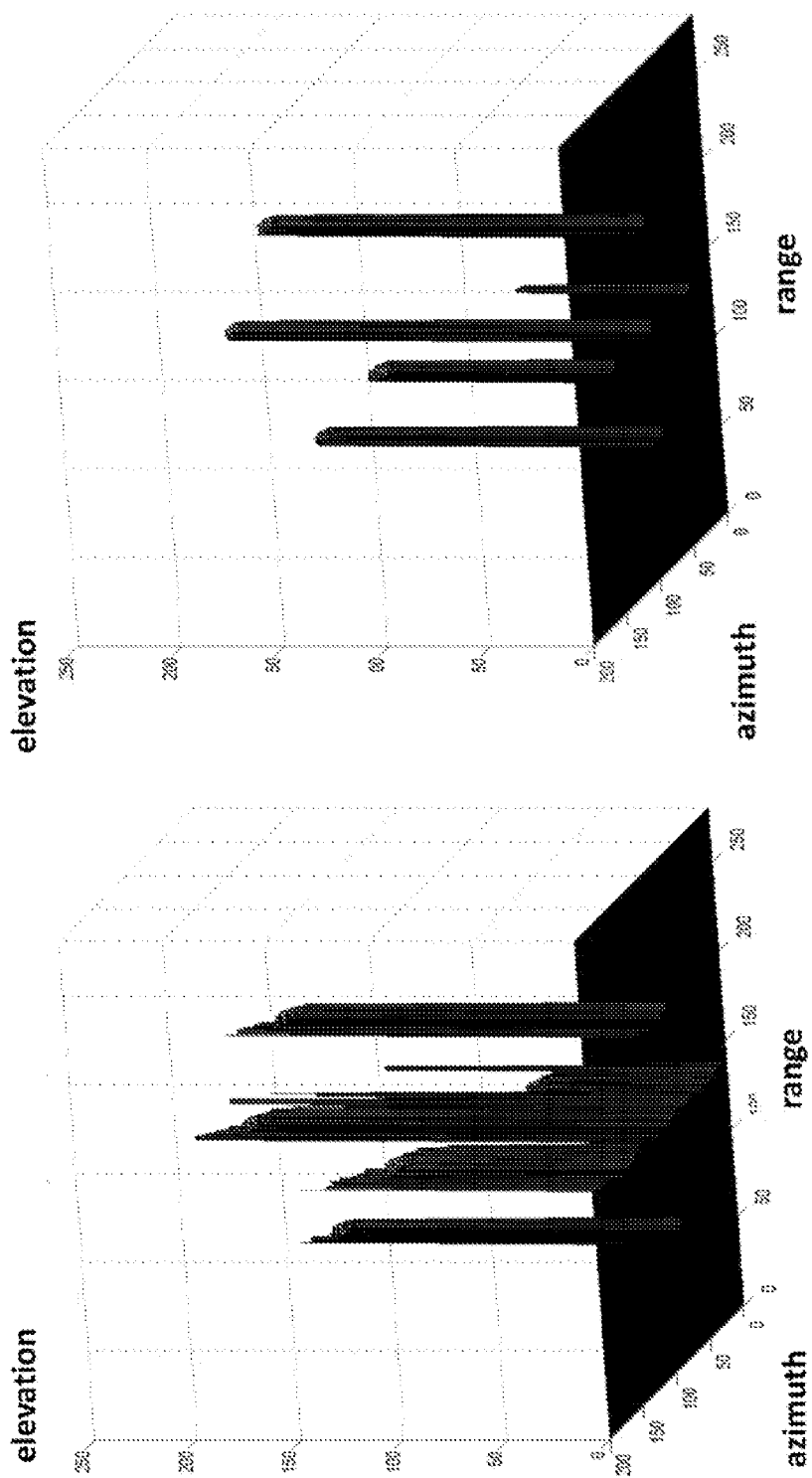

SYSTEM AND METHOD FOR 3D SAR IMAGING USING COMPRESSIVE SENSING WITH MULTI-PLATFORM, MULTI-BASELINE AND MULTI-PRF DATA

FIELD OF THE INVENTION

This invention relates generally to synthetic radar systems, and more particularly to tomographic 3-dimensional imaging systems.

BACKGROUND OF THE INVENTION

Synthetic aperture radar (SAR) systems exploit the motion of antennas arranged on a moving platform to synthesize a large virtual aperture and, thus, achieve high resolution imaging. Each virtual array at different spatial location forms a baseline. A single pass (single baseline) SAR system is capable of imaging a 2-dimensional (2D) range-azimuth reflectivity of an area of interest without any elevation resolution. However, the 3-dimensional (3D) structure of the area, such as 3D terrain features, is not preserved.

The 2D image is essentially a projection of the 3D reflectivity space into the 2D range-azimuth imaging plane. This projection can cause several artifacts. For example, in layover artifacts, several terrain patches with different elevation angles are mapped in the same range-azimuth resolution cell, see Gini et al, "Layover solution in multibaseline SAR interferometry," IEEE Trans. Antennas and propagation, vol. 38(4), pp. 1344-1356, October 2002.

In shadowing artifacts, certain areas are not visible to the SAR system because another structure is in the illumination path. These artifacts cannot be resolved by a single pass, even using interferometric SAR techniques.

With the launch of the TerraSAR-X and the COSMO-Skymed satellites, 3D imaging has become possible. Those systems exploit stacks of complex-valued SAR images from multiple passes, which are collected at different baselines and at different time, to form 3D images that capture the 3D location and motion information of scattering objects, see Fornaro et al, "Three-dimensional focusing with multipass SAR data," IEEE Trans. Geoscience and Remote Sensing, vol. 41(3), pp. 507-517, March 2003.

As shown in FIG. 1, a conventional 3D SAR system for generating a 3D image using multiple baseline arrays of antennas 101 mounted on a single radar platform in a 3D elevation, range and azimuth space. The figure shows point scatterers 102 for different elevations.

FIG. 2 show a conventional 3D imaging process for the system of FIG. 1. Data 201 are acquired at each baseline (1, ..., N) 101. 2D SAR imaging 210 is applied independently to each data 201 to construct 2D images ($I_1$, $I_2$, ..., $I_N$) 215. The images are registered and aligned 220, followed by 3D image reconstruction 230 to obtain a 3D image 240.

With the additional elevation dimension, the 3D image can separate multiple scatterers along elevation, even when the scatterers are present in the same range-azimuth location. However, 3D imagery requires several trade-offs. First, to acquire images at multiple baselines, the platform needs to perform several passes over the area of interest. This makes data collection time consuming and very expensive. Second, the elevation resolution is much worse than that of range and azimuth due to the small elevation aperture, which is known as a tight orbital tube, of modern SAR sensors, e.g., ≈500 m diameter.

The elevation resolution can be improved using compressive sensing (CS) based approaches, see Zhu et al. "Tomographic SAR inversion by $L_1$-norm regularization—the compressive sensing approach," IEEE Trans. Geoscience and Remote Sensing, vol. 48(10), pp. 3839-3846, October 2010. That CS approach uses multiple baselines, a single PRF of a single SAR platform. In that method, a 2D range-azimuth image is reconstructed for each baseline. Then, compressive sensing based method is used improve elevation resolution. That method only considers sparsity for each 2D range-azimuth pixel.

SUMMARY OF THE INVENTION

The embodiments of the invention provide a compressive sensing sensing (CS) based method for synthetic aperture radar (SAR) imaging. The method reduces the total amount of raw data that need to be acquired, and increases a resolution of elevation. In particular, the embodiments use SAR data collected at multiple parallel baselines in an azimuth-elevation plane. The resolution in elevation is substantially higher than for a conventional 3D SAR system. The increase is about 4 times.

The elevation of each baseline is randomly distributed in an available elevation space. In addition, the antenna array at each baseline uses a fixed pulse repetition frequency (PRF) or pulse repetition rate (PRR), which is the number of pulses per time unit (e.g., seconds). The PRF for each baseline is different. Therefore, the multiple baselines provide flexibility for data acquisition. For example, the data can be acquired during multiple passes of a single SAR platform or from different SAR platforms. Assuming all the baselines are aligned and located in the spatial domain, the multi-baseline data can be used to generate a high resolution 3D reflectivity map, using a CS-based iterative imaging method.

The embodiments provide several advantages. In particular, using the CS-based method, 3D reflectivity can be generated using only a very small number of baselines, which saves time and expense for data collection. Second, by jointly processing data with different PRFs, it becomes possible to fuse data, not only from multiple passes of a single SAR platform, but also from multiple radar platforms. With multiple platforms, it is possible to form a much larger virtual elevation aperture compared to a single SAR platform, resulting a much higher elevation resolution, e.g., 4 times the elevation resolution of a conventional 3D SAR system.

The method is related to 3D tomographic SAR imaging and CS-based SAR imaging, but with novel contributions. In contrast to earlier efforts, the embodiments allow multiple different PRFs in the multi-baseline data, which extends the data source from a single SAR platform to multiple platforms and enables a much larger elevation aperture. In addition, the embodiments provide a novel CS-based iterative imaging method that operates directly on the acquired raw data.

BRIEF DESCRIPTION OF THE DRAWINGS

FIG. 4 is a block diagram of a system and method for generating a 3D image using the multiple synthetic aperture radar systems of FIG. 3 according to the embodiments of the invention.

FIG. 5A shows point scatterers for conventional imaging;

FIG. 5B shows point scatterers for CS based imaging according to embodiments of the invention;

FIG. 6A shows a prior art reconstructions for FIG. 5A; and

FIG. 6B shows a reconstruction for FIG. 5B according to embodiments of the invention.

DETAILED DESCRIPTION OF THE PREFERRED EMBODIMENTS

Figure 1:
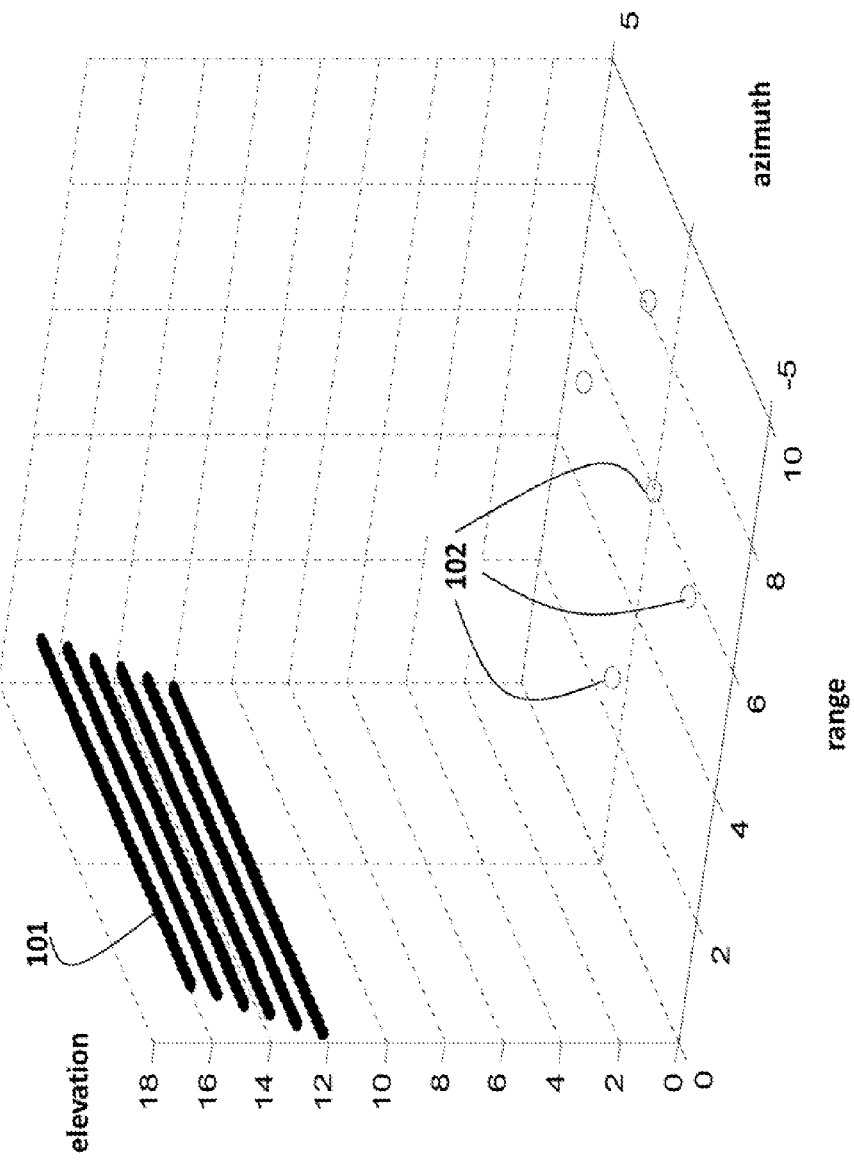
FIG. 1 is a schematic of a conventional tomographic synthetic aperture radar system.
Figure 2:
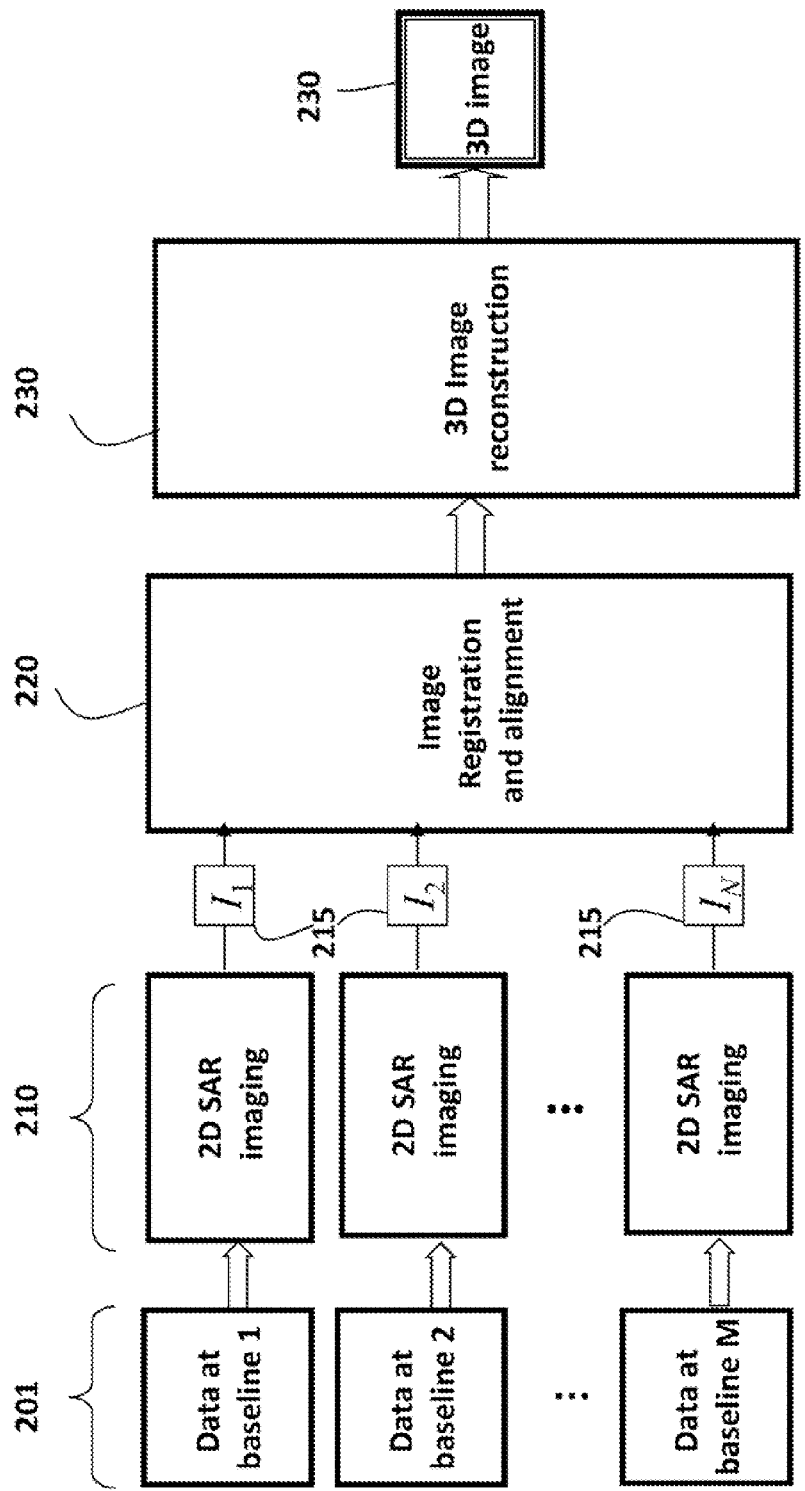
FIG. 2 is a block diagram of a conventional multi-baseline synthetic aperture radar system.
Figure 3:
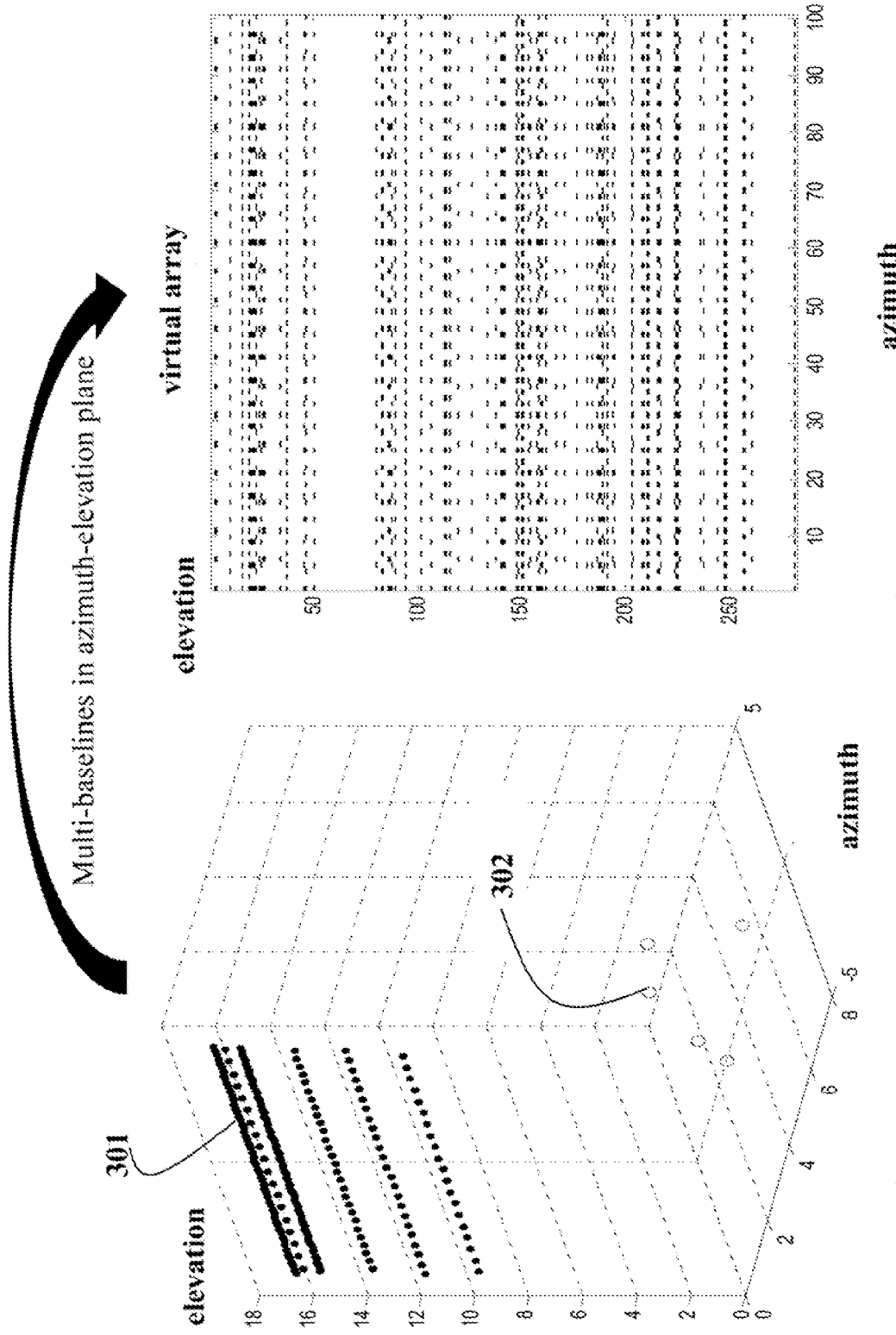
FIG. 3 is a schematic of a compressive sensing based 3D synthetic aperture radar system according to embodiments of the invention.

As shown in FIGS. 3 and 4, the embodiments of the invention provide a method lot generating a synthetic aperture radar (SAR) 3D image. The method acquires data sets at multiple baselines 301 and multiple pulse repetition frequency (PRF). The multiple base lines can be established using a single platform performing several passes over an area of interest, or multiple different platforms passing over the same area.

For the purpose of this description, we consider point scatterers 302 as well as 3D objects placed in a 3D space. We consider a total of 70 baselines randomly distributed in space along elevation direction. These baselines are selected from 281 possible baselines, uniformly spaced along the elevation, see FIG. 3. The total number of baselines is substantially less than for a conventional 3D SAR system.

In our simulation, we only need 25% of total baselines needed for a conventional 3D SAR system, yet we can increase the elevation resolution by about 4 times.

At each baseline, the SAR raw data sets are acquired with a fixed PRF. However, for different baseline, the corresponding PRF is randomly selected to be different than other PRF. Specifically, starting with a base PRF, data sets from all baselines are downsampled by a random integer amount. In other words, each PRF is a fraction of the base PRF. With the downsampling rate randomly selected from a set {2, 3, 4, 5}. We assume all the data sets are perfectly aligned.

We compare two different approaches. A first conventional approach uses reduced data collection at 70 baselines, each with different PRF, and conventional imaging methods. In the approach according to the embodiment, we use reduced data collection and our CS-based imaging approach. For the conventional 3D imaging, we use a near-field range migration imaging procedure by upsampling the data and filling the missing data with zeros. That procedure produces a fast beamforming result from the acquired data and implements an inverse of the acquisition operator.

For CS-based imaging, we fill in the missing data using an iterative procedure that exploits the sparsity of the scene, and then perform fast range-migration imaging.

As shown in FIG. 4, data sets 401 are acquired from a set of SAR systems {1, . . . N}. As stated above, the data sets can be acquired 405 during multiple passes of a single system, where for the purpose of this description, each pass generates an independent data set, or multiple passes by different SAR systems, or some combination of multiple passes of a single system and independent systems.

The data sets 401 are registered and aligned 410 to produce aligned data sets 415. After the alignment, CS-base 3D image reconstruction is applied directly 420 to the aligned multiple-baseline, multiple-PRF data sets 415 to obtain the 3D SAR image 430.

FIG. 5A shows point scatterers for conventional imaging, where aliasing 501 in azimuth and elevation can be seen due to down sampling.

FIG. 5B shows point scatterers for CS based imaging with abasing removed according to the embodiments of the invention.

FIG. 6A shows the reconstructions for FIG. 5A with significant degradation and low resolution in both azimuth and elevation.

FIG. 6B shows the reconstruction for FIG. 5B. As can be seen, the CS-based approach significantly improves the reconstruction, despite the limited data available. In fact, the recovery is very close to conventional imaging using available data.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for generating a 3D image of an area, wherein the 3D image is a synthetic aperture radar (SAR) image, comprising the steps of:

acquiring multiple data sets from the area using one or more SAR systems, wherein each SAR system has at least a pair of parallel baselines and multiple pulse repetition frequency (PRF), wherein a predetermined PRF for each baseline is randomly selected from the multiple PRF to be different from other PRF;

registering and aligning the data sets to produce aligned data sets; and applying a 3D compressive sensing reconstruction procedure to the aligned data sets to generate the 3D image corresponding to the area, wherein the steps are performed in a processor.

2. The method of claim 1, wherein the data sets are sampled uniformly at each baseline.

3. The method of claim 1, wherein the baselines are parallel to each other.

4. The method of claim 1, wherein a number of baselines is determined to be less than for a predetermined 3D SAR system.

5. The method of claim 1, wherein the data are acquired from multiple SAR systems or multiple passes of a single SAR system.

6. The method of claim 1, wherein the multiple baselines are randomly spatially distributed.

7. The method of claim 1, wherein an elevation aperture is larger than a single SAR orbit tube.

8. The method of claim 1, wherein the all the data sets are processed.

9. The method of claim 1, wherein the compressive sensing method is an iterative reconstruction method.

10. The method of claim 1, wherein an elevation resolution is determined to be higher than for a predetermined 3D SAR system.

11. A system for generating a 3D image of an area, wherein the 3D image is a synthetic aperture radar (SAR) image, comprising:

one or more SAR systems configured to acquire multiple data sets from the area using, wherein each SAR system has at least a pair of parallel baselines and multiple pulse repetition frequency (PRF), wherein a predetermined PRF for each baseline is randomly selected from the multiple PRF to be different from other PRF; and a processor configured to register and align the data sets to produce aligned data sets, apply a 3D compressive sensing reconstruction procedure to the aligned data sets to generate the 3D image corresponding to the area.

12. The method of claim 9, the iterative reconstruction method includes a step of filling missing data in a sparsity of a scene.

13. The method of claim 12, the iterative reconstruction method performs fast range-migration imaging.

14. A non-transitory computer-readable medium having stored thereon a computer program for generating a 3D image of an area, the 3D image being a synthetic aperture radar (SAR) image, the computer program comprising a set of instructions for causing a processor to perform the steps of:

acquiring multiple data sets from the area using one or more SAR systems, wherein each SAR system has at least a pair of parallel baselines and multiple pulse repetition frequency (PRF), wherein a predetermined PRF for each baseline is randomly selected from the multiple PRF to be different from other PRF;

registering and aligning the data sets to produce aligned data sets; and applying a 3D compressive sensing reconstruction procedure to the aligned data sets to generate the 3D image corresponding to the area, wherein the steps are performed in a processor.

* * * * *